US011686240B2

(12) United States Patent
Jochman

(10) Patent No.: US 11,686,240 B2
(45) Date of Patent: Jun. 27, 2023

(54) POWER SYSTEM RADIATORS AND POWER SYSTEMS HAVING RADIATORS

(71) Applicant: Illinois Tool Works Inc., Glenview, IL (US)

(72) Inventor: Nathan J. Jochman, Appleton, WI (US)

(73) Assignee: Illinois Tool Works Inc., Glenview, IL (US)

( * ) Notice: Subject to any disclaimer, the term of this patent is extended or adjusted under 35 U.S.C. 154(b) by 1015 days.

(21) Appl. No.: 16/513,139

(22) Filed: Jul. 16, 2019

(65) Prior Publication Data

US 2020/0025058 A1 Jan. 23, 2020

Related U.S. Application Data

(60) Provisional application No. 62/700,034, filed on Jul. 18, 2018.

(51) Int. Cl.
| | | |
|---|---|---|
| *B23K 9/10* | (2006.01) | |
| *B23K 37/00* | (2006.01) | |
| *F01P 3/18* | (2006.01) | |
| *F02B 63/04* | (2006.01) | |
| *H05K 7/20* | (2006.01) | |
| *H02K 7/18* | (2006.01) | |
| *B23K 37/02* | (2006.01) | |

(52) U.S. Cl.
CPC .............. *F01P 3/18* (2013.01); *B23K 9/1043* (2013.01); *F02B 63/048* (2013.01); *H02K 7/1807* (2013.01); *H05K 7/209* (2013.01); *H05K 7/20909* (2013.01); *B23K 37/0294* (2013.01); *F01P 2070/50* (2013.01)

(58) Field of Classification Search
CPC ........ F01P 3/18; B23K 9/1043; F02B 63/048; H02K 7/1807
See application file for complete search history.

(56) References Cited

U.S. PATENT DOCUMENTS

| 6,933,465 B2 | 8/2005 | Bankstahl |
| 10,786,859 B2 * | 9/2020 | Hruska ................ B23K 9/1006 |
| 11,084,115 B2 * | 8/2021 | Nelson ................ F02B 63/044 |

(Continued)

FOREIGN PATENT DOCUMENTS

| CN | 18583841 | 12/2017 |
| JP | H03260316 | 11/1991 |
| WO | 2012100635 | 8/2012 |

OTHER PUBLICATIONS

Int'l Search Report and Written Opinion Appln No. PC/US2019/042162 dated Oct. 9, 2019.

*Primary Examiner* — Long T Tran
(74) *Attorney, Agent, or Firm* — McAndrews, Held & Malloy, Ltd.

(57) ABSTRACT

Power system radiators and power systems having radiators are disclosed. An example power system includes: an engine; a generator configured to generate electrical power from mechanical power provided by the engine; power conversion circuitry configured to convert the electrical power from the generator to welding-type power; and a housing enclosing the engine, the generator, and the power conversion circuitry; and a radiator assembly configured to cool the engine and comprising a heat exchanger oriented substantially horizontally when the power system is installed.

19 Claims, 10 Drawing Sheets

(56) References Cited

U.S. PATENT DOCUMENTS

| | | | |
|---|---|---|---|
| 2006/0054113 A1* | 3/2006 | Yasuda | F02B 63/04 123/41.7 |
| 2008/0042625 A1* | 2/2008 | Konop | F02B 77/13 322/1 |
| 2008/0264921 A1 | 10/2008 | Kropp | |
| 2017/0107901 A1* | 4/2017 | Terada | F01P 5/06 |
| 2017/0187981 A1 | 6/2017 | Park | |
| 2018/0298731 A1* | 10/2018 | Bishop | H02J 3/381 |
| 2019/0099824 A1* | 4/2019 | Taylor | F01P 7/02 |

* cited by examiner

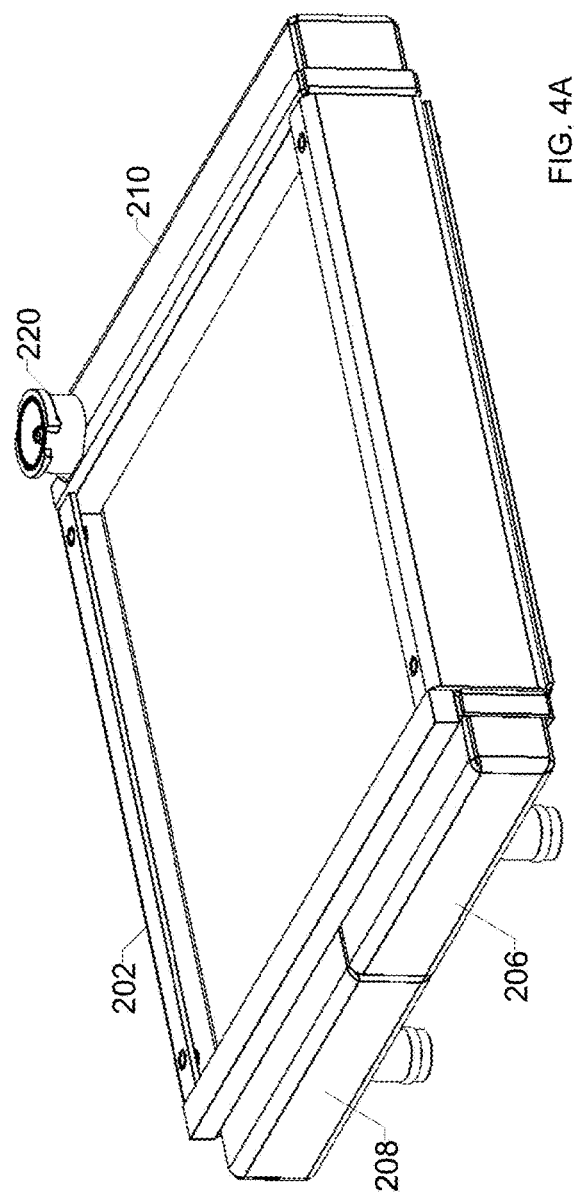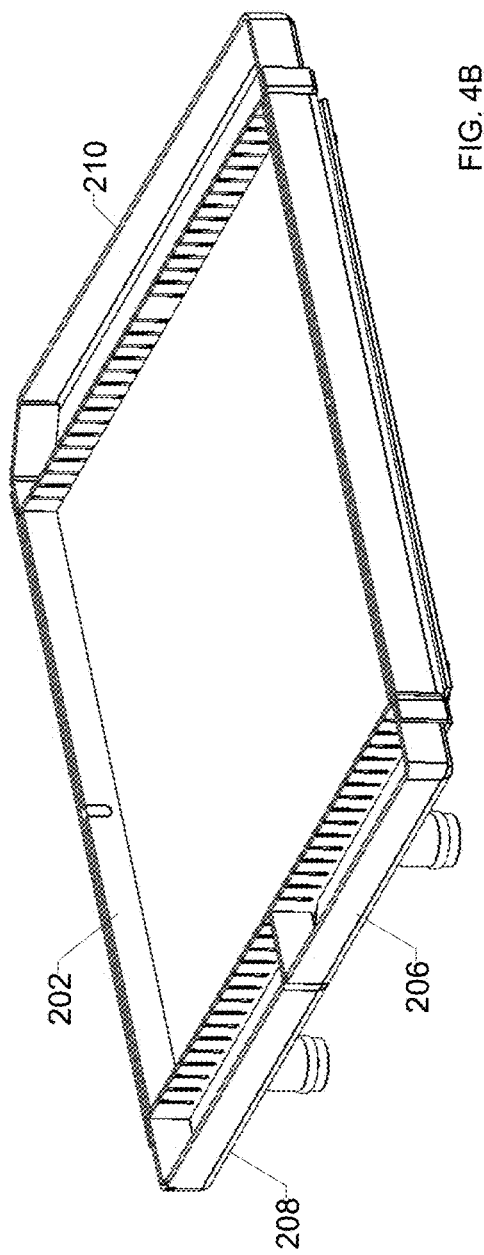

1

POWER SYSTEM RADIATORS AND POWER SYSTEMS HAVING RADIATORS

BACKGROUND

This disclosure relates generally to power systems for work vehicles and, more particularly, to power system radiators and power systems having radiators.

Engine driven welders, service packs, or auxiliary power units are equipment with integral engines and power systems that can be mounted to or integrated into a service truck, trailer, van, or other vehicles. The engine driven equipment is often integrated with the vehicle

SUMMARY

Power system radiators and power systems having radiators are disclosed, substantially as illustrated by and described in connection with at least one of the figures, as set forth more completely in the claims.

BRIEF DESCRIPTION OF THE DRAWINGS

FIG. 4A is a perspective view of the example heat exchanger of FIG. 3.

FIG. 4B is a cross-section view of the example heat exchanger of FIG. 3.

The figures are not necessarily to scale. Where appropriate, similar or identical reference numbers are used to refer to similar or identical components.

DETAILED DESCRIPTION

Figure 1:
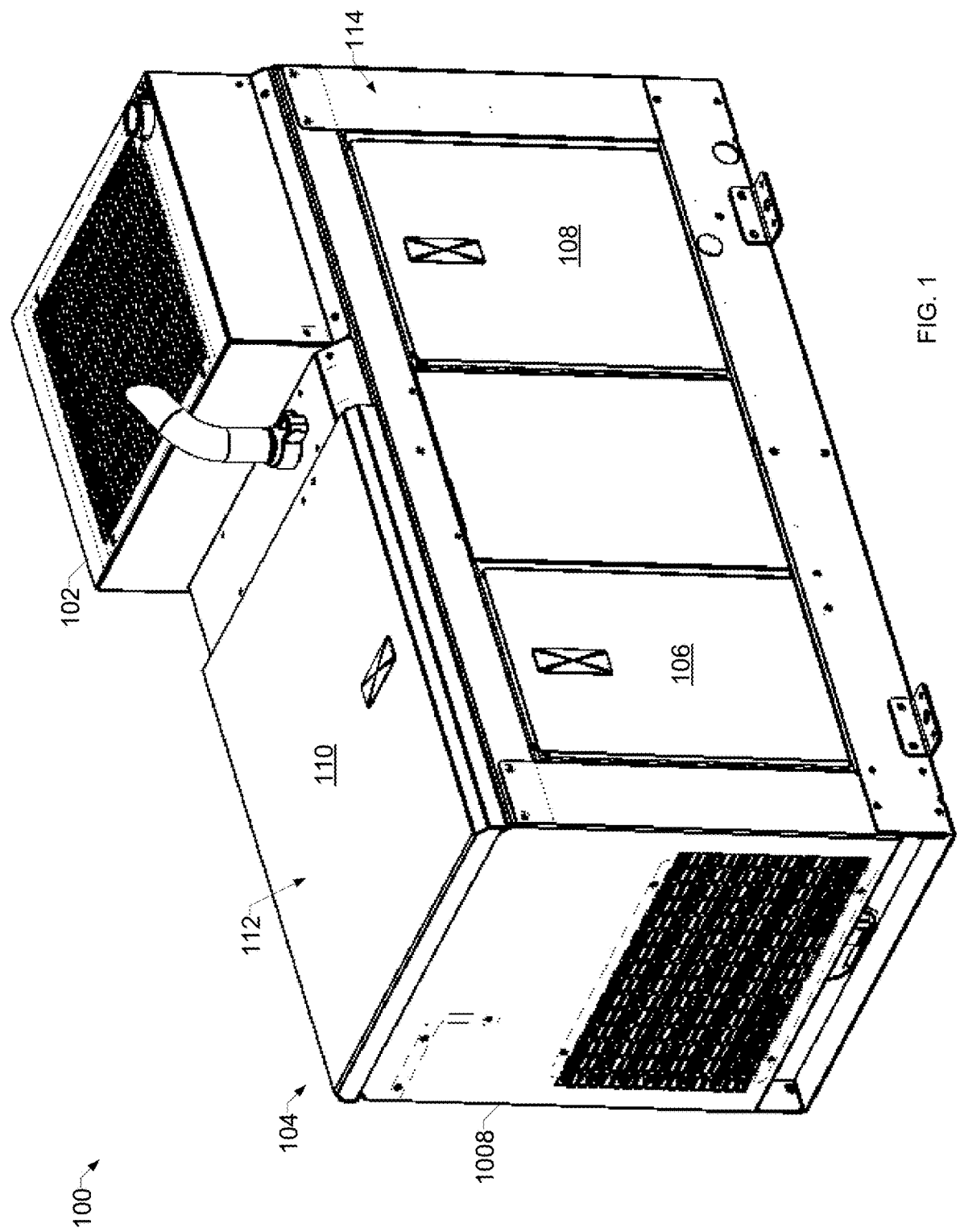
FIG. 1 is a perspective view of an example power system including a radiator assembly mounted on an exterior of the power system housing, in accordance with aspects of this disclosure.

When installing power systems on service trucks, the power systems are commonly mounted in the load space, directly behind the cab and in between the tool boxes on either side of the vehicle bed, or mounted on top of a tool box on either side. The load space is limited, because the distance between the tool boxes is typically between 48 and 54 inches. Additionally, the back of the cab and/or the tool boxes can have wall heights that are in excess of typical engine driven equipment. These obstructions are a major cause of overheating of conventional engine-driven equipment due to hot air blockage and/or recirculation. Obstructions also limit what the sides of power systems that are accessible. In the load space location, typically only the top and rear facing (relative to the vehicle) sides are accessible when the unit is installed.

With service vans, conventional power systems have been mounted on the underside of a box van floor, near the front of the van box on the inside with added air ducting, and/or near the back of the van box were the rear doors are located. Installation of conventional power systems inside the service van box requires that the air into and out of the machine either needs to be specially ducted out of the van box, or that the doors of the van be left open for natural convection of the air to occur to cool the power system. When the machine is installed in a van box, the engine exhaust is also a major concern due to the need to direct the exhaust outside of the van box.

To improve ease of installation, proper utilization of the space on the vehicle, proper cooling of the equipment, and environmental protection, disclosed example power systems include a radiator assembly positioned substantially horizontally and/or external to a housing of the power system. In some examples, the housing of the power system is configured to be installed within the typical distance between tool boxes on a work truck (e.g., 48-54 inches), and/or with substantially zero clearance on up to two sides of the power system. Disclosed example power systems include a radiator assembly without increasing the footprint of the power systems relative to a power system that does not include the radiator assembly, thereby improving cooling capacity while permitting installation of the power systems in desirable but confined locations (e.g., the load space) on work trucks and/or work vans.

Disclosed example power systems improve cooling by reducing hot air recirculation. For example, in disclosed systems the hot air exits in a direction to reduce recirculation (e.g., upward). Some examples include a variable speed fan to improve temperature management efficiency by only cooling as much as needed. The electric fan enables driving the fan in reverse to improve cleaning of the radiator.

Some example power systems provide a hinged radiator assembly to improve service access, coolant filling, and/or cleaning. In some examples, the radiator assembly is mounted remotely from the power system to further improve cooling performance. In some examples, the radiator assembly is positioned in a cross-flow configuration in which the coolant traverses the heat exchanger in a substantially horizontal direction. As used herein, the term "substantially horizontal" means within 20° of horizontal. In some such examples, a raised radiator side tank improves de-aeration and draw-down, thereby improving serviceability and/or reliability of the power system.

Disclosed example power systems provide a configuration of a power system having a consistent physical and/or electrical installation connections for multiple different internal engine types, positioning of power conversion circuitry for cooling and environmental protection, improved cable routing locations, and a single location for making electrical and/or fluid connections with external components and/or vehicle connections. As a result, example power systems provide flexible positioning, easier and less costly installation, and multiple engine types.

Welding-type power, as used herein, refers to power suitable for welding, plasma cutting, induction heating, electrode preheating, CAC-A and/or hot wire welding/preheating (including laser welding and laser cladding).

As used herein, the terms "power system," "service pack" and "auxiliary power unit" refer to an engine driven power source which may be auxiliary or supplemental to a primary power source such as a vehicle engine.

Disclosed example power systems include: an engine; a generator configured to generate electrical power from mechanical power provided by the engine; power conversion circuitry configured to convert the electrical power from the generator to welding-type power; a housing enclosing the engine, the generator, and the power conversion circuitry; and a radiator assembly configured to cool the engine and comprising a heat exchanger oriented substantially horizontally when the power system is installed.

In some examples, the radiator assembly includes: a fan configured to urge air through the heat exchanger to cool the heat exchanger; a first side tank configured to receive coolant from the engine and to supply the coolant to the heat exchanger; and a second side tank configured to receive the coolant from the heat exchanger for circulation to the engine. Some example power systems further include a third side tank having a higher vertical position than the first side tank or the second side tank, in which the third side tank is configured to deaerate the coolant. In some examples, the third side tank includes a coolant filling neck. In some examples, a top surface of the third side tank has a higher vertical position than top surfaces of the first side tank and the second side tank. In some examples, the radiator assembly is located on top of the housing, is coupled to the housing via one or more hinges, and is configured to pivot with respect to the housing such that the third side tank is elevated above the heat exchanger, the first side tank, and the second side tank.

In some example power systems, the radiator assembly is oriented such that the coolant flows substantially horizontally within the heat exchanger. In some examples, the radiator assembly is located on top of the housing, and is coupled to the housing via one or more hinges. In some examples, the radiator assembly is configured to pivot with respect to the housing to provide access to an interior of the housing from a top of the housing. In some examples, a coolant inlet line and a coolant outlet line are coupled to the radiator assembly adjacent the hinges. In some example power systems, the radiator assembly is mounted to the housing, the radiator assembly comprising an electrically powered fan.

In some example power systems, the radiator assembly is located remote from the housing, and further includes coolant lines coupled between the engine and the radiator assembly to transfer coolant between the engine and the radiator assembly. In some examples, the radiator assembly is configured to be mounted to a surface other than the housing.

In some example power systems, the engine is a gasoline engine or a diesel engine. In some examples, the radiator assembly includes: a heat exchanger; and a fan configured to urge air through the housing and through the heat exchanger to cool the heat exchanger and one or more of the engine, the generator, or the power conversion circuitry. In some examples, the housing is configured to direct the air to exit the housing via the radiator assembly. In some examples, the housing has no opening on two of the sides of the housing.

Some other disclosed example power systems include: an engine; a generator configured to generate electrical power from mechanical power provided by the engine; power conversion circuitry configured to convert the electrical power from the generator to welding-type power; a housing enclosing the engine, the generator, and the power conversion circuitry; and a radiator assembly positioned external to the housing and configured to cool the engine.

In some examples, the radiator assembly includes: a fan configured to urge air through the heat exchanger to cool the heat exchanger; a first side tank configured to receive coolant from the engine and to supply the coolant to the heat exchanger; and a second side tank configured to receive the coolant from the heat exchanger for circulation to the engine. Some example power systems further include a third side tank having a higher vertical position than the first side tank or the second side tank, in which the third side tank is configured to deaerate the coolant. In some examples, the third side tank includes a coolant filling neck. In some examples, a top surface of the third side tank has a higher vertical position than top surfaces of the first side tank and the second side tank. In some examples, the radiator assembly is located on top of the housing, is coupled to the housing via one or more hinges, and is configured to pivot with respect to the housing such that the third side tank is elevated above the heat exchanger, the first side tank, and the second side tank.

In some example power systems, the radiator assembly is oriented such that the coolant flows substantially horizontally within the heat exchanger. In some examples, the radiator assembly is located on top of the housing, and is coupled to the housing via one or more hinges. In some examples, the radiator assembly is configured to pivot with respect to the housing to provide access to an interior of the housing from a top of the housing. In some examples, a coolant inlet line and a coolant outlet line are coupled to the radiator assembly adjacent the hinges. In some example power systems, the radiator assembly is mounted to the housing, the radiator assembly comprising an electrically powered fan.

In some example power systems, the radiator assembly is located remote from the housing, and further includes coolant lines coupled between the engine and the radiator assembly to transfer coolant between the engine and the radiator assembly. In some examples, the radiator assembly is configured to be mounted to a surface other than the housing.

In some example power systems, the engine is a gasoline engine or a diesel engine. In some examples, the radiator assembly includes: a heat exchanger; and a fan configured to urge air through the housing and through the heat exchanger to cool the heat exchanger and one or more of the engine, the generator, or the power conversion circuitry. In some examples, the housing is configured to direct the air to exit the housing via the radiator assembly. In some examples, the housing has no opening on two of the sides of the housing.

FIG. 1 is a perspective view of an example power system 100 including a radiator assembly 102 mounted on an exterior of a housing 104. The example power system 100 may be configured for installation on a work truck, a work van, and/or any other vehicle. The power system 100 may supply electrical power, compressed air, and/or hydraulic power for a range of applications. The power system 100 may be supplemental to a main power plant (e.g., vehicle engine). The service pack may be physically positioned at any suitable location in the vehicle. For example, the power system may be mounted on, beneath, or beside the vehicle bed or work platform rear of the vehicle cab. In some such vehicles, the vehicle chassis provides mechanical support for the power system For example, steel tubing, rails or other support structures extending between front and rear axles of the vehicle may serve as a support for an power system 100. A particularly convenient location for installation of the power system 100 is the approximate forward center of the vehicle bed, between the tool boxes on each side of the vehicle. However, this location may have a maximum practical footprint, within which the power system 100 must fit to be installed.

The power system 100 may include one or more service systems driven by an engine 116. The engine 116 drives a generator 118, a hydraulic pump (when present), and/or an air compressor 120 (when present). The engine 116 may be of any desired type, such as gasoline, diesel, natural gas, liquid petroleum gas, and/or other engines. The generator 118 may be directly driven by the engine 116, such as by close coupling the generator 118 to the engine 116, or may be belt or chain-driven. The generator 118 may be a three-phase brushless generator, capable of producing power for a range of applications. However, other generators may be employed, including single-phase generators and generators capable of producing multiple power outputs. The hydraulic pump may be based on any conventional technology, such as piston pumps, gear pumps, vane pumps, with or without closed-loop control of pressure and/or flow. The air compressor 120 may also be of any suitable type, such as a rotary screw air compressor or a reciprocating compressor based upon one or more reciprocating pistons.

The power system includes appropriate conduits, wiring, tubing, and/or other systems for conveying the service generated by these components to an access point. For example, the power system 100 may include electrical cabling, hydraulic circuits to conduct hydraulic pressure, air circuits to conduct air pressure, etc. The wiring and circuitry may include protective circuits for the electrical power, including fuses, circuit breakers, interlocks, and/or other circuitry, and/or valving for the hydraulic and/or air service. Electrical power may be conditioned (e.g., rectified, smoothed, filtered, etc.). DC power outputs may be provided by rectification, filtering and regulating of AC output. Valving for hydraulic power output may include by way example, pressure relief valves, check valves, shut-off valves, and/or directional control valving. The hydraulic pump draws fluid from and returns fluid to a fluid reservoir, which may include an appropriate vent for the exchange of air during use with the interior volume of the reservoir, and/or a strainer or filter for the hydraulic fluid. Similarly, the air compressor 120 draws air from the environment through an air filter.

In some examples, the generator 118 and/or electrical circuitry is coupled to the vehicle electrical system and/or the vehicle battery. Thus, the power system 100 may power electrical loads without operation of the main vehicle engine, and/or the vehicle battery may serve as a shared battery, while maintaining the battery in a good state of charge by the output of the generator 118 and/or power conversion circuitry 122.

A control panel provides input and/or output devices to control the power system 100. The service panel may be located on any surface of the vehicle and/or on multiple locations in the vehicle, and may be covered by doors or other protective structures. The control panel may be located near or remote from the location at which the electrical, hydraulic, and/or pneumatic power is accessible. The control panel may permit, for example, starting and stopping of the engine 116 by a keyed ignition or starter button, operator interfaces for monitoring the engine 116, fuel level gauges, pressure gauges, indicators for parameters such as pressure, speed, voltage, and/or current. The control panel may also include a stop, disconnect or disable switch to prevent starting of the engine 116, such as during transport.

In use, the service pack will provide power for the on-site applications completely separately from the vehicle engine. That is, the engine 116 generally may not be powered during transit of the vehicle from one service location to another, or from a service garage or facility to a service site. Once located at the service site, the vehicle may be parked at a convenient location, and the vehicle engine may be shut down. The power system engine 116 may then be powered, to provide service from one or more of the service systems described above. Where desired, clutches, or other mechanical engagement devices may be provided for engagement and disengagement of one or more of the generator 118, the hydraulic pump and the air compressor 120, depending upon which services are required. Moreover, as in conventional vehicles, where stabilization of the vehicle or any of the systems is require, the vehicle may include outriggers, stabilizers (not shown), and so forth which may be deployed after parking the vehicle and prior to operation of the service pack. One or more of the services provided by the work vehicle may be performed without the need to operate the main vehicle engine at a service site.

The housing 104 of FIG. 1 encloses the engine 116, the generator 118, the air compressor 120, the hydraulic pump, the power conversion circuitry 122, a fuel tank 124, cooling and/or ventilation systems, and/or other components of the power system 100, and provides access to the interior of the housing 104 for servicing of the interior components. For example, access doors 106, 108, 110 are located on the top side 112 and a first lateral side 114 of the housing 104. As described in more detail below, the power system 100 may be installed with substantially zero clearance between two or more sides of the power system 100 and the vehicle.

Figure 2:
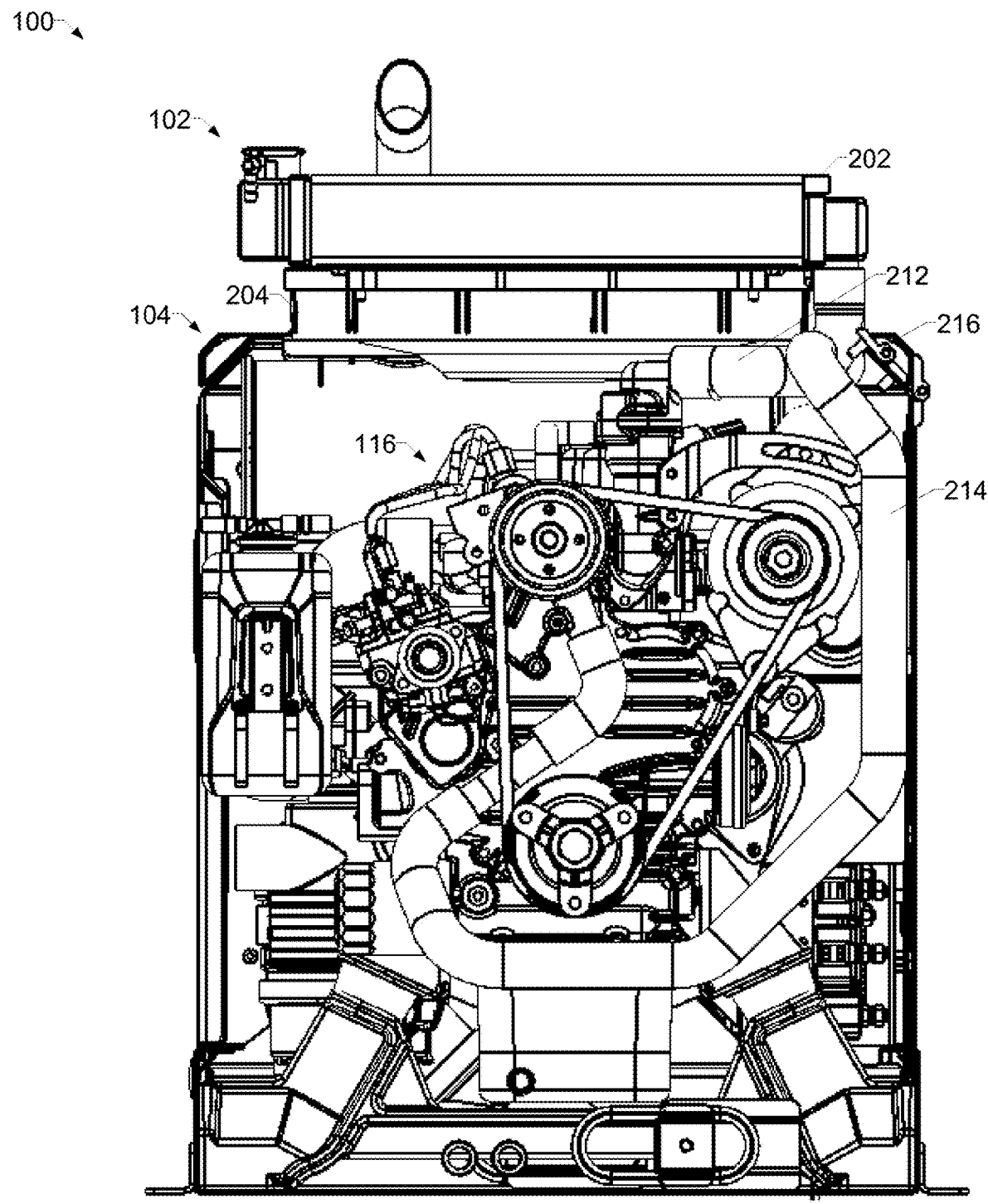
FIG. 2 is a rear elevation view of a cross-section of the example power system of FIG. 1, including the radiator assembly.
Figure 3:
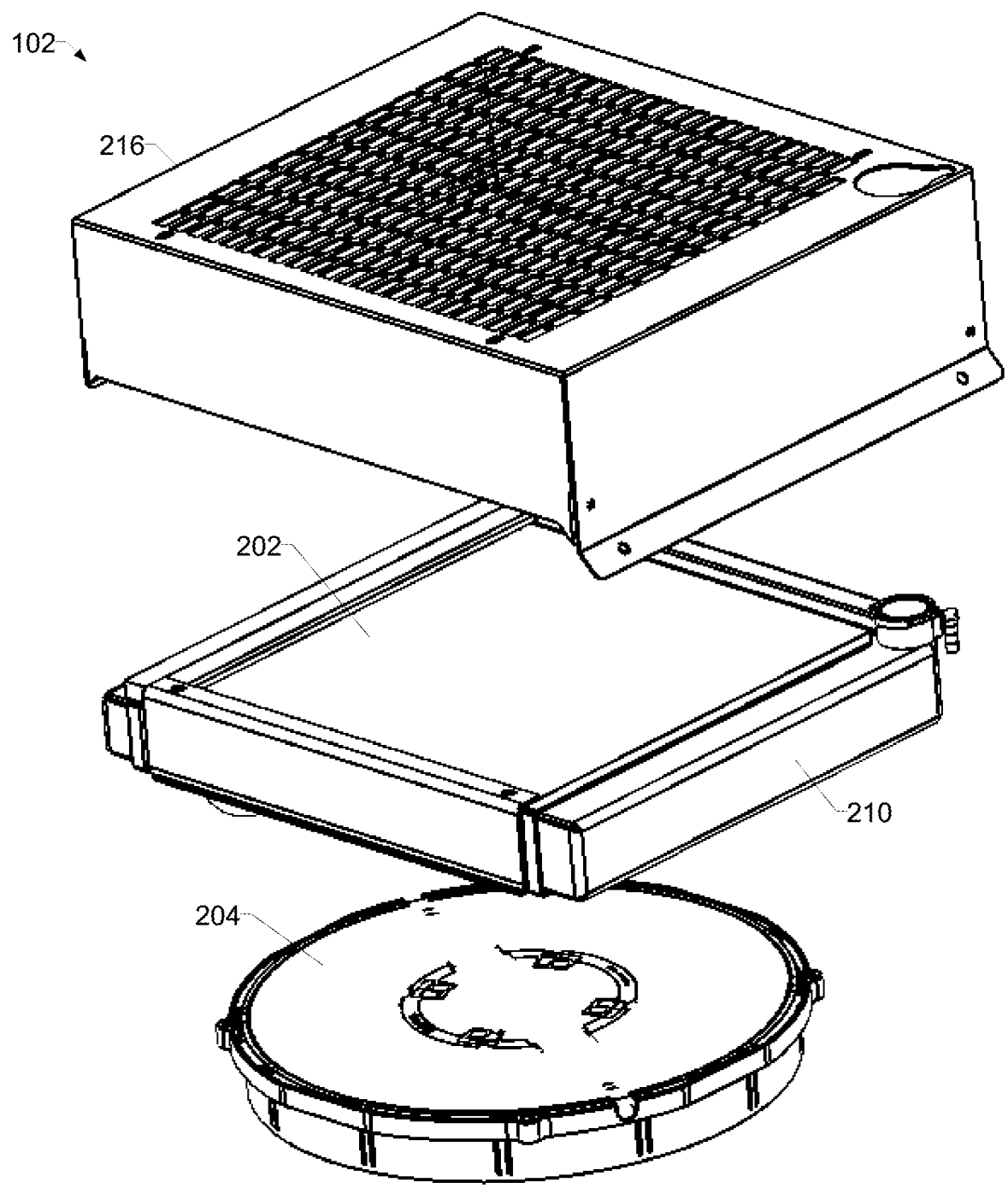
FIG. 3 is a partially exploded view of the example radiator assembly of FIG. 1.
Figure 5:
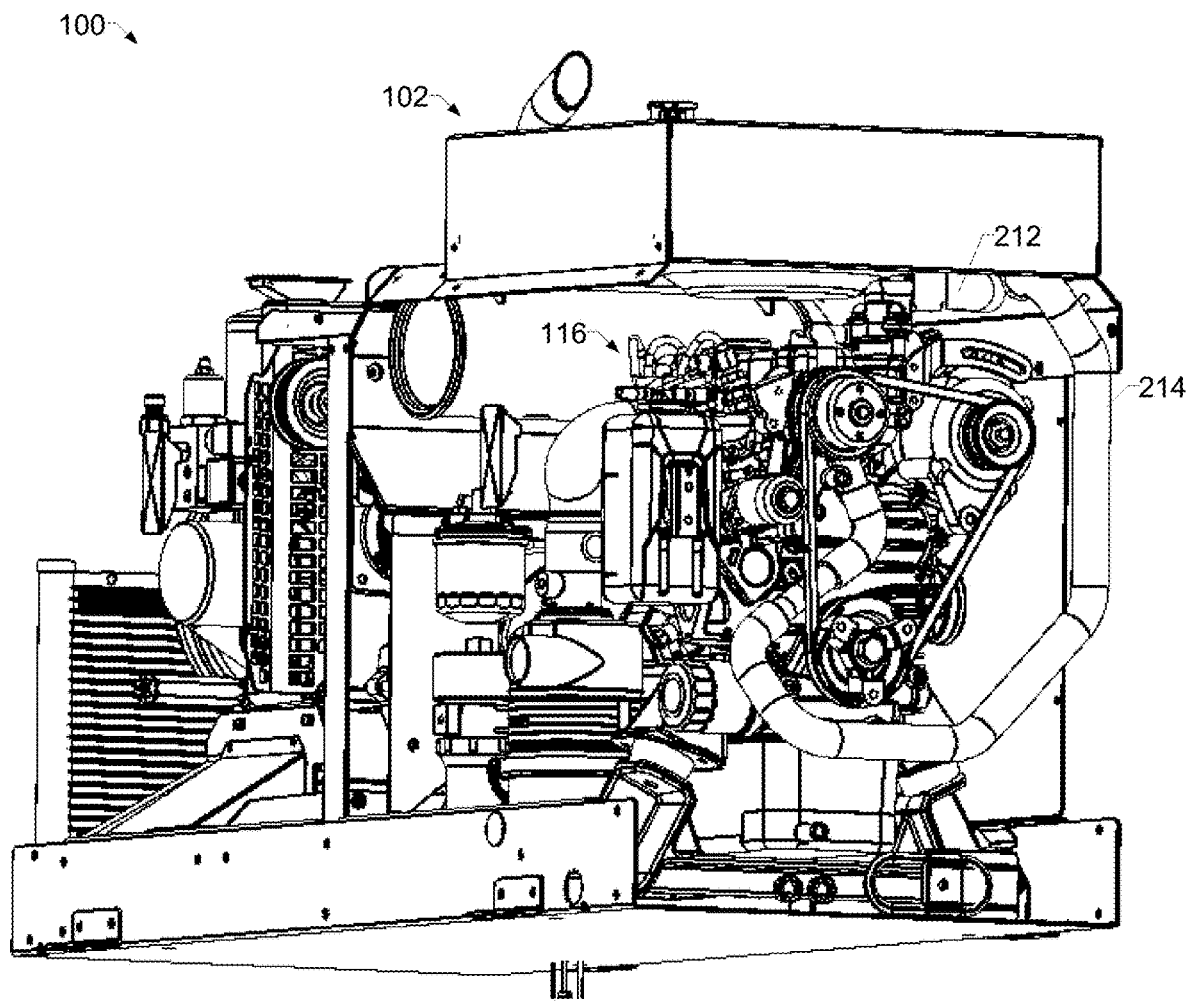
FIG. 5 is a rear perspective view of the example power system of FIG. 1 illustrating coolant lines coupling the radiator assembly and the engine.

The radiator assembly 102 is positioned exterior to the housing 104, and is configured to cool the engine 116 during operation of the engine 116. FIG. 2 is a rear elevation view of a cross-section of the example power system 100 of FIG. 1, including the radiator assembly 102. FIG. 3 is a partially exploded view of the example radiator assembly 102 of FIG. 1. FIG. 4A is a perspective view of the example heat exchanger 202 of FIG. 3. FIG. 4B is a cross-section view of the example heat exchanger 202 of FIG. 3. FIG. 5 is a rear perspective view of the example power system of FIG. 1 illustrating the coolant lines 212, 214 coupling the radiator assembly 102 and the engine 116.

The example radiator assembly 102 includes a heat exchanger 202, a fan 204, and side tanks 206, 208, 210. The heat exchanger 202 transmits heat from coolant passing through the heat exchanger 202 to air blown past the heat exchanger 202 by the fan 204. The heat exchanger 202 is oriented such that the coolant flows substantially horizontally within the radiator assembly. In contrast to an engine-mounted fan, the fan 204 is attached to the radiator assembly 102 reduces or eliminates the potential for interfering with the fan shroud when the engine moves on isolator mounts.

The fan 204 urges air through the heat exchanger 202, which transfers the heat from the heat exchanger 202, thereby cooling the heat exchanger 202. The fan 204 may be an electrically powered fan, which may be controlled based on the engine speed to provide the appropriate cooling. The side tank 206 receives coolant from the engine 116 via a coolant line 212, and supplies the coolant to the heat exchanger 202. The coolant passes through the heat exchanger 202 to the side tank 208. The side tank 208 receives the coolant from the heat exchanger 202 for circulation to the engine 116 via a coolant line 214.

The example side tank 210 has a higher vertical position than the first side tank 206 or the second side tank 208, to deaerate the coolant. For example, the side tank 210 has a higher top surface than the side tanks 206, 208. The side tank 210 has larger dimensions to allow air in the cooling system to collect and/or to improve the draw-down capacity of the radiator assembly 102. The side tank 210 allows for a space for air to gather and escape when the cap is opened, and/or to be pushed to a recovery tank if a radiator cap is installed during normal operation.

Figure 6:
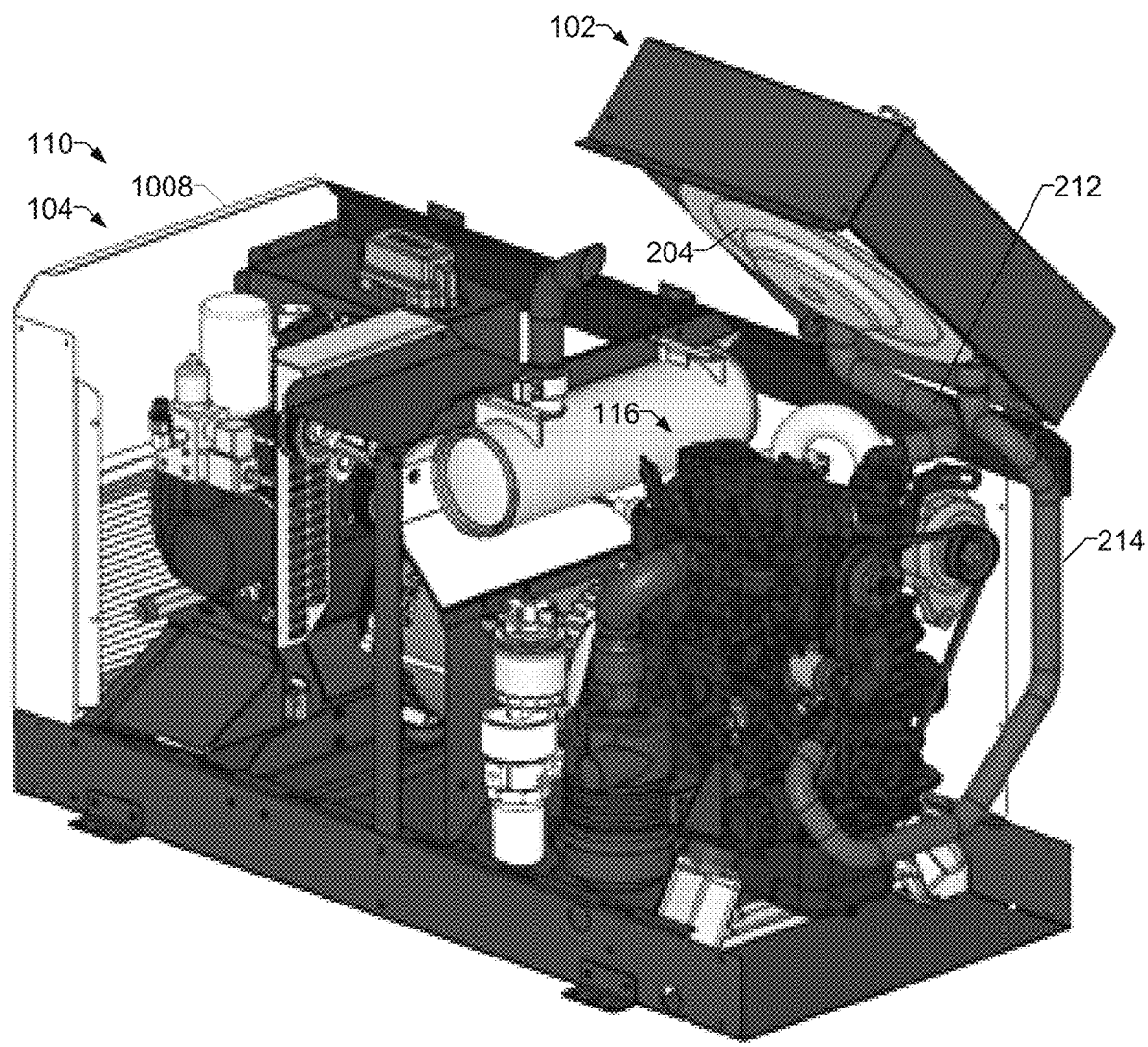
FIG. 6 is a rear perspective view of the example power system of FIG. 1 illustrating the radiator assembly in an elevated orientation to permit access to an interior of the power system housing.

A housing 216 of the radiator assembly 102 is coupled to the housing 104 via one or more hinges 218. The radiator assembly 102 is configured to pivot with respective to the housing 104 to provide access to an interior of the housing from a top of the housing 104. FIG. 6 is a rear perspective view of the example power system 100 of FIG. 1 illustrating the radiator assembly 102 in an elevated orientation to permit access to an interior of the housing 104 of the power system 100. The hinges 218 enable the radiator assembly 102 to pivot from a horizontal orientation to a more vertical orientation, without disconnecting the coolant lines 212, 214 and/or electrical connections, and without removing any coolant from the radiator assembly 102. The side tanks 206-210 are arranged such that, when the radiator assembly 102 is pivoted at the hinges 218, the side tank 210 is lifted to a higher position than the side tanks 206, 208 and the heat exchanger 202. The side tank 210 includes a coolant filling neck 220 to improve the deaeration of the radiator assembly 102. The coolant inlet line 212 and the coolant outlet line 214 are coupled to the radiator assembly 102 adjacent the hinges 218.

The pivoting of the radiator assembly 102 improves ease of servicing the engine 116 by allowing easy access to the engine and related components, improves coolant filling by allowing air to escape faster when the radiator is pivoted to a vertical position, and/or improves cleaning by allowing access to both sides of the heat exchanger 202. The fan 204 could also periodically blow in reverse to aid cleaning of the heat exchanger 202 by pushing out debris.

Figure 7:
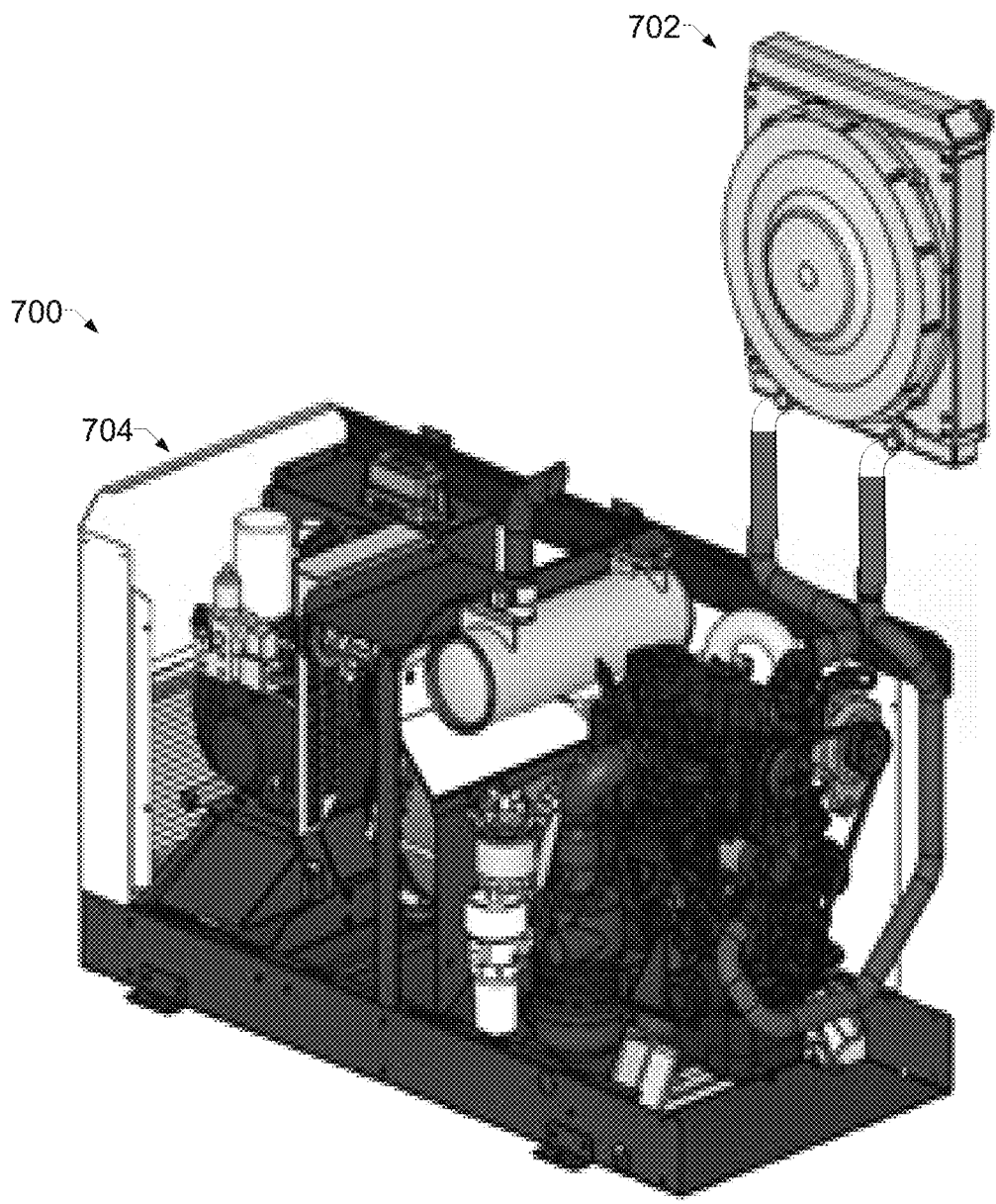
FIG. 7 is a perspective view of another example power system including a radiator assembly positioned remotely from the power system housing to improve performance of the radiator, in accordance with aspects of this disclosure.

FIG. 7 is a perspective view of another example power system 700 including a radiator assembly 702 positioned remotely from a housing 704 of the power system 700 to improve cooling performance. The example power system 700 is similar to the power system 100 of FIG. 1, and may be installed inside of box vans and/or other enclosed locations on vehicles. Similarly, the radiator assembly 702 may be similar to the radiator assembly 102 of FIG. 1, with a housing that enables the radiator assembly 702 to be mounted to an external surface.

By remotely mounting the radiator assembly 702, the radiator assembly 702 moves hot air away from the enclosed space such that the engine can still be cooled even if the power system 700 is installed in an enclosed location. In addition to improving engine cooling, remote mounting of the radiator assembly 702 reduces heating of the enclosed area of the vehicle that contains the engine driven unit.

Figure 8:
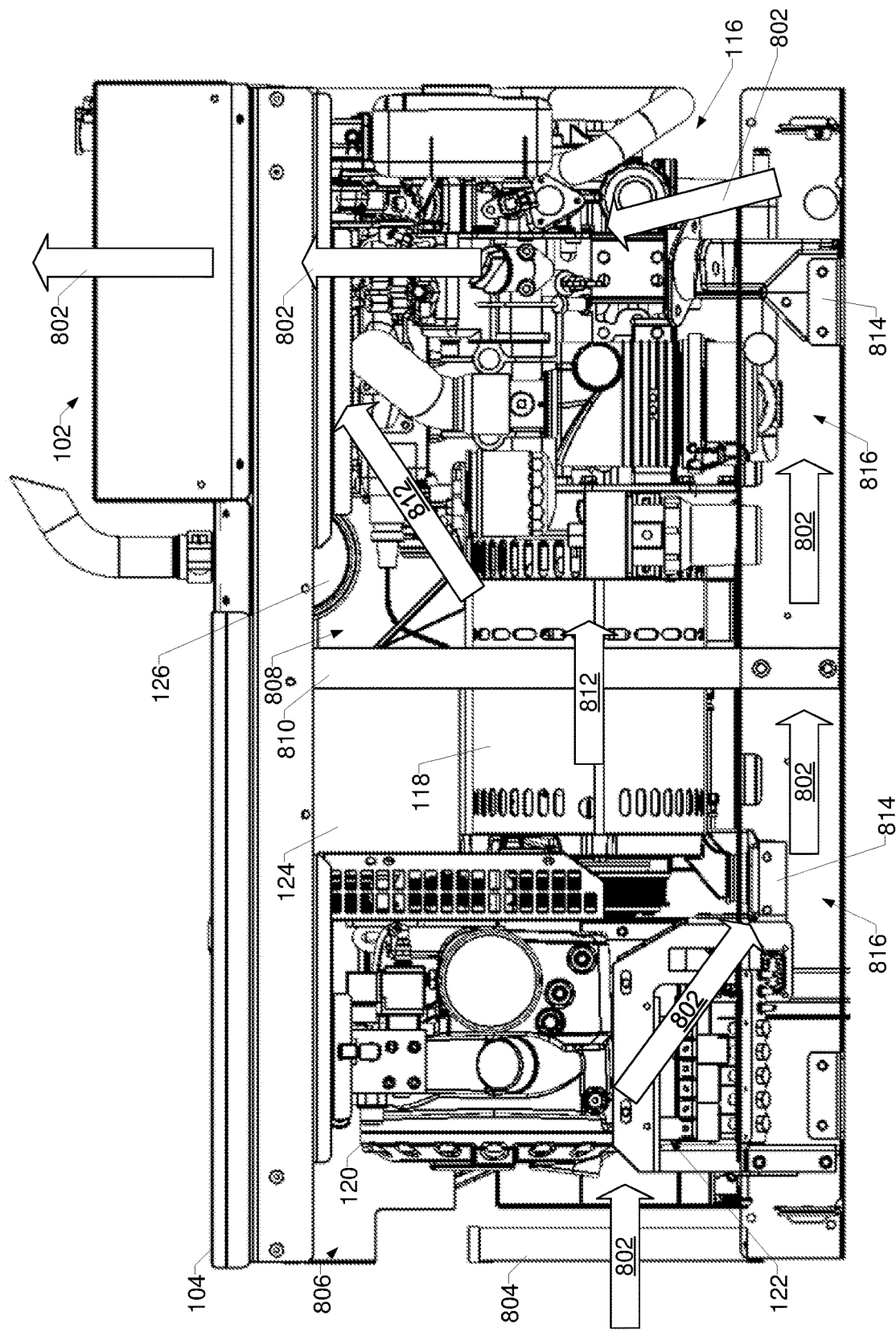
FIG. 8 is a side elevation view of the example power system of FIG. 1 illustrating an advantageous airflow path through the housing of the power system for cooling components within the housing.
Figure 9:
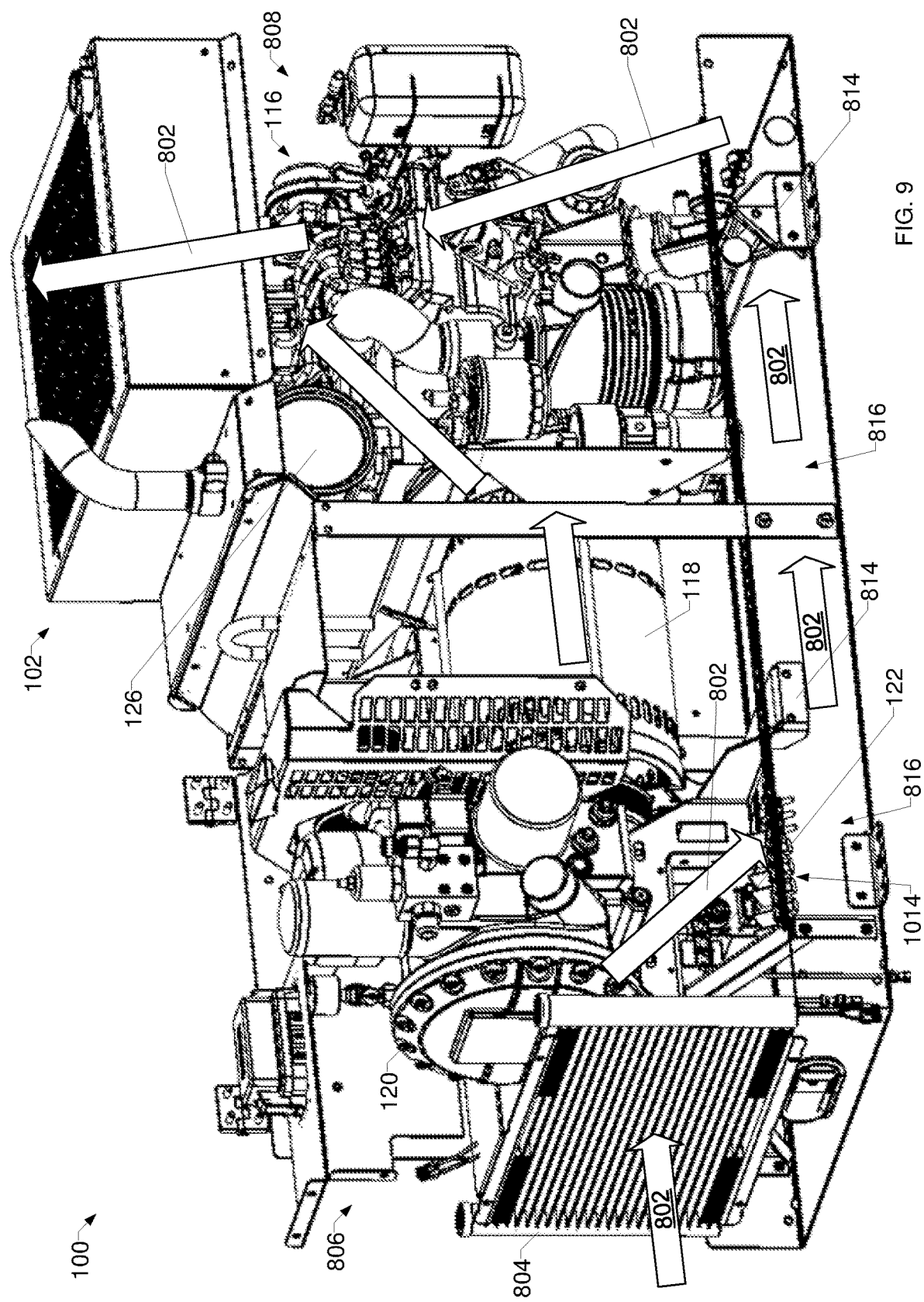
FIG. 9 is a perspective view of the example power system of FIG. 1 illustrating the airflow path of FIG. 8.

FIG. 8 is a side elevation view of the example power system 100 of FIG. 1 illustrating an advantageous air routing path 802 through the housing 104, for cooling components within the housing 104. FIG. 9 is a perspective view of the example power system 100 of FIG. 1 illustrating the air routing path 802 of FIG. 8.

To facilitate the air routing path 802, the housing 104 includes an air intake 804 at a first location on the exterior of the housing 104. The air routing path 802 directs air from the air intake 804 through the housing 104 to the radiator assembly 102, from which the heated air is used to cool the heat exchanger 202 and expelled from the power system 100. The air routing path 802 is defined by the housing 104 and traverses the housing through at least one first compartment 806 containing lower-temperature components (e.g., the air compressor 120, the power conversion circuitry 122, the generator 118, etc.) before being directed to a second compartment containing higher temperature components (e.g., the engine 116, a muffler, etc.). The first compartment 806 is separated from the second compartment 808 by a separation barrier 810 to reduce or prevent cooler air in the first compartment 806 from mixing with hotter air in the second compartment 808.

The example air routing path 802 travels through and/or around, in order, the air compressor 120 (and/or an associated compressor cooler), the power conversion circuitry 122, underneath the engine 116 mounted in the housing 104, through and/or around the engine 116, past a muffler 126, and out the radiator assembly 102 on the top of the housing 104. The example air routing path 802 allows the power system 100 to be installed into truck and/or other tight applications with zero clearance on more than one side. Because there are no access or airflow inlets or exits present (and/or negligible inlets and/or outlets present) on multiple sides of disclosed example housing 104, and only one side has an airflow intake, the zero clearance can be achieved on the other sides.

The generator 118 may include a small generator fan to specifically cool the generator windings, thereby providing a secondary airflow path 812 from the first compartment 806 to the second compartment 808. The generator fan moves air from the first compartment 806 to the second compartment 808 to maintain a single air inlet and a single air outlet. The generator fan can be significantly smaller than the radiator fan 204, and is not the primary driver of the air flow, because the generator fan primarily cools the generator 118. Additionally, the generator fan does not bypass the separation barrier 810 or permit the hot air from the second compartment 808 to mix into the cool air in the first compartment 806.

The air routing path 802 and the secondary airflow path 812 are advantageous in that compressor 120 and the power conversion circuitry 122, which require the coolest air for proper cooling, are cooled first. The partially heated air used to cool the compressor 120 and the power conversion circuitry 122 is capable of cooling the engine 116 and the generator 118.

The housing 104 includes brackets 814 to support the engine 116, the generator 118, the compressor 120, the power conversion circuitry 122, the fuel tank 124 and/or, more generally, the components of the power system 100 above a bottom of the housing 104. The brackets 814 provide a cable routing and airflow path 816 along the bottom of the housing 104 and below the brackets 814.

In some examples, the radiator fan 204 is controlled based on sensing the temperature of one or more components of the power system 100. For example, an increase in temperature of the engine 116, the air compressor 120, and/or the power conversion circuitry 122 may cause the speed of the radiator fan 204 to increase, which increases the airflow through the housing 104 and cooling of the engine 116, the air compressor 120, the power conversion circuitry 122. In examples in which the radiator assembly 102 is located remotely from the housing (e.g., the power system 700 of FIG. 7), a second fan may be positioned above the second compartment 808 to provide the cooling airflow through the housing 104.

Figure 10:
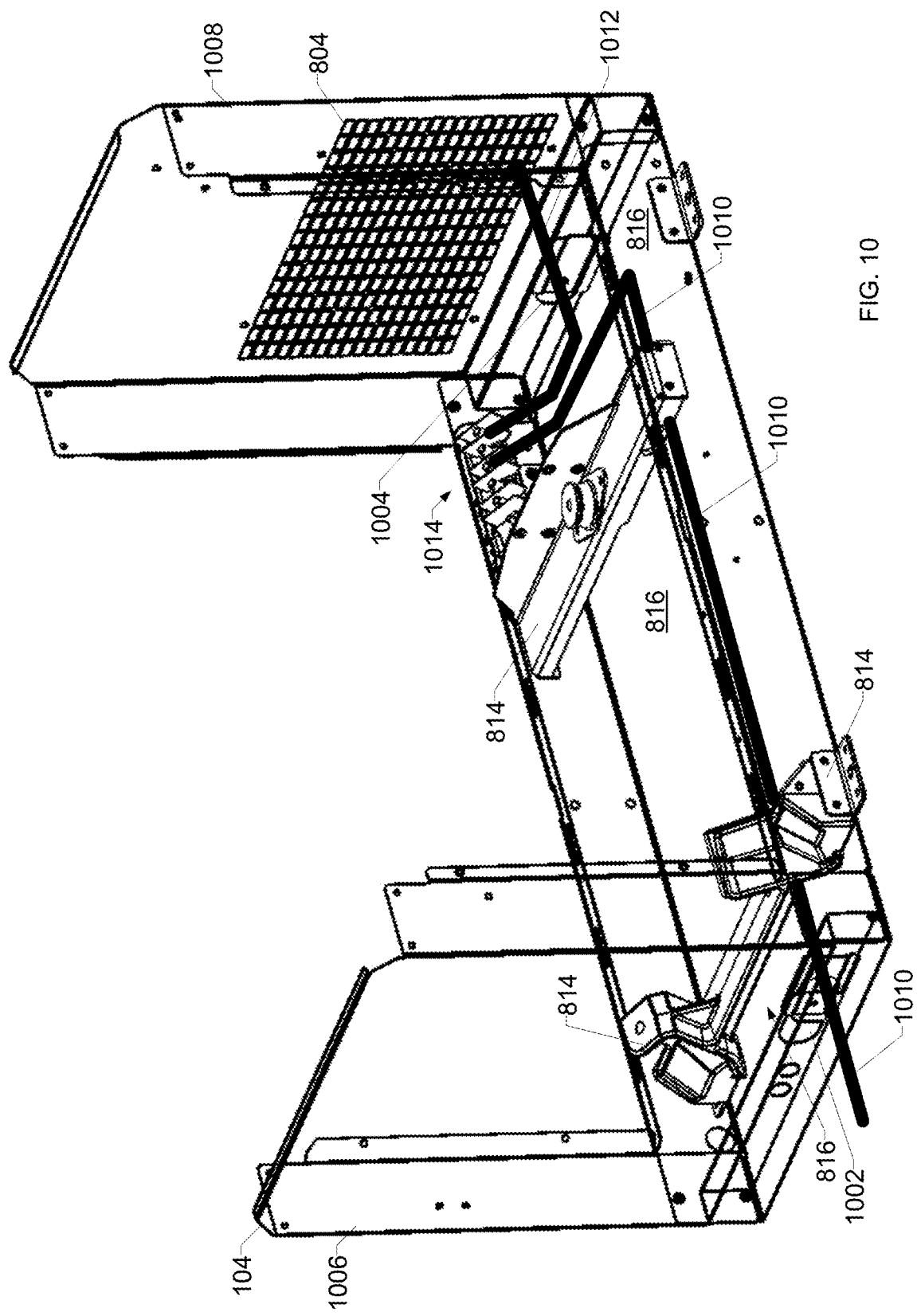
FIG. 10 is a perspective view of openings in the housing of the power system to enable routing of cables and hoses from an exterior of the housing to the example cable routing and airflow path within the housing.

Installing cables or hoses from locations on the vehicle (e.g., from remote control panels, electric and/or hydraulic cranes, compressed air tanks, weld terminals, AC and/or DC receptacles, gauges, the vehicle electrical system, etc.) to the power system 100 involves routing the cables and/or hoses from different locations. FIG. 10 is a perspective view of openings in the housing 104 of the power system 100 to enable routing of cables and hoses from an exterior of the housing 104 to the example cable routing and airflow path 816 within the housing 104.

The example housing 104 includes openings 1002, 1004 on opposing panels 1006, 1008 of the housing 104, near a bottom of the housing 104. Cables (e.g., an example cable 1010) and/or hoses (e.g., an example hose 1012) may be routed through the openings 1002, 1004 from an exterior of the power system 100 to the cable routing and airflow path 816. From the cable routing and airflow path 816, the cables 1010 and/or hoses 1012 may be easily routed to a cable and hose termination region 1014, which is accessible via a side access panel in the housing 104 (e.g., the access door 106 of FIG. 1), including after the power system 100 is installed in the vehicle. The cable and hose termination region 1014 may be a single location or area for making connections for control conductors, AC power conductors, DC power conductors, welding-type power conductors, compressed air hoses, and/or hydraulic fluid hoses. The example openings 1002, 1004 may be provided with recessed sliding doors and/or other removable covers. The openings 1002, 1004 and the cable routing and airflow path 816 allow the cables, hoses, and/or other connections to enter the housing 104 from either end, be easily routed through the housing 104, and be terminated to the appropriate components in the power system 100. The example power system 100 greatly simplifies and speeds unit installation.

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set {(x), (y), (x, y)}. In other words, "x and/or y" means "one or both of x and y". As another example, "x, y, and/or z" means any element of the seven-element set {(x), (y), (z), (x, y), (x, z), (y, z), (x, y, z)}. In other words, "x, y and/or z" means "one or more of x, y and z". As utilized herein, the term "exemplary" means serving as a non-limiting example, instance, or illustration. As utilized herein, the terms "e.g.," and "for example" set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.).

While the present method and/or system has been described with reference to certain implementations, it will be understood by those skilled in the art that various changes may be made and equivalents may be substituted without departing from the scope of the present disclosure. In addition, many modifications may be made to adapt a particular situation or material to the teachings of the present disclosure without departing from its scope. For example, systems, blocks, and/or other components of disclosed examples may be combined, divided, re-arranged, and/or otherwise modified. Therefore, the present method and/or system are not limited to the particular implementations disclosed. Instead, the present method and/or system will include all implementations falling within the scope of the appended claims, both literally and under the doctrine of equivalents.

What is claimed is:

1. A power system, comprising:
   an engine;
   a generator configured to generate electrical power from mechanical power provided by the engine;
   power conversion circuitry configured to convert the electrical power from the generator to welding-type power;
   a housing enclosing the engine, the generator, and the power conversion circuitry; and
   a radiator assembly configured to cool the engine and comprising:
   a heat exchanger oriented substantially horizontally when the power system is installed;
   a fan configured to urge air through the heat exchanger to cool the heat exchanger;
   a first side tank located on a first side of the heat exchanger and configured to receive coolant from the engine and to supply the coolant to the heat exchanger; and
   a second side tank located on a second side of the heat exchanger and configured to receive the coolant from the heat exchanger for circulation to the engine.

2. The power system as defined in claim 1, further comprising a third side tank having a higher vertical position than the first side tank or the second side tank, the third side tank configured to deaerate the coolant.

3. The power system as defined in claim 2, wherein the third side tank comprises a coolant filling neck.

4. The power system as defined in claim 2, wherein a top surface of the third side tank has a higher vertical position than top surfaces of the first side tank and the second side tank.

5. The power system as defined in claim 2, wherein the radiator assembly is located on top of the housing, is coupled to the housing via one or more hinges, and is configured to pivot with respect to the housing such that the third side tank is elevated above the heat exchanger, the first side tank, and the second side tank.

6. The power system as defined in claim 1, wherein the radiator assembly is oriented such that coolant flows substantially horizontally within the heat exchanger.

7. The power system as defined in claim 1, wherein the engine is a gasoline engine or a diesel engine.

8. The power system as defined in claim 1, wherein the radiator assembly comprises:
   a heat exchanger; and
   a fan configured to urge air through the housing and through the heat exchanger to cool the heat exchanger and one or more of the engine, the generator, or the power conversion circuitry.

9. The power system as defined in claim 8, wherein the housing is configured to direct the air to exit the housing via the radiator assembly.

10. The power system as defined in claim 1, wherein the housing has no opening on two of the sides of the housing.

11. A power system, comprising:
   an engine;
   a generator configured to generate electrical power from mechanical power provided by the engine;
   power conversion circuitry configured to convert the electrical power from the generator to welding-type power;
   a housing enclosing the engine, the generator, and the power conversion circuitry; and
   a radiator assembly configured to cool the engine and comprising a heat exchanger oriented substantially horizontally when the power system is installed, wherein the radiator assembly is located on top of the housing, and is coupled to the housing via one or more hinges.

12. The power system as defined in claim 11, wherein the radiator assembly is configured to pivot with respect to the housing to provide access to an interior of the housing from a top of the housing.

13. The power system as defined in claim 12, wherein a coolant inlet line and a coolant outlet line are coupled to the radiator assembly adjacent the hinges.

14. The power system as defined in claim 11, wherein the radiator assembly is mounted to the housing, the radiator assembly comprising an electrically powered fan.

15. A power system, comprising:
   an engine;
   a generator configured to generate electrical power from mechanical power provided by the engine;
   power conversion circuitry configured to convert the electrical power from the generator to welding-type power;
   a housing enclosing the engine, the generator, and the power conversion circuitry; and
   a radiator assembly configured to cool the engine and comprising a heat exchanger oriented substantially horizontally when the power system is installed, wherein the radiator assembly is located remote from the housing, and further comprising coolant lines coupled between the engine and the radiator assembly to transfer coolant between the engine and the radiator assembly.

16. The power system as defined in claim 15, wherein the radiator assembly is configured to be mounted to a surface other than the housing.

17. A power system, comprising:
   an engine;
   a generator configured to generate electrical power from mechanical power provided by the engine;
   power conversion circuitry configured to convert the electrical power from the generator to welding-type power;
   a housing enclosing the engine, the generator, and the power conversion circuitry; and
   a radiator assembly positioned external to the housing and configured to cool the engine.

18. The power system as defined in claim 17, wherein the radiator assembly is located on top of the housing, and is coupled to the housing via one or more hinges.

19. The power system as defined in claim 17, wherein the radiator assembly is located remote from the housing, and further comprising coolant lines coupled between the engine and the radiator assembly to transfer coolant between the engine and the radiator assembly.

\* \* \* \* \*